United States Patent [19]

Keenan

[11] Patent Number: 5,020,139
[45] Date of Patent: May 28, 1991

[54] THREE DIGIT CHANNEL ENTRY BY USE OF AN EXTENDED KEYPRESS

[75] Inventor: Douglas M. Keenan, Indianapolis, Ind.

[73] Assignee: RCA Licensing Corporation, Princeton, N.J.

[21] Appl. No.: 489,392

[22] Filed: Mar. 5, 1990

[51] Int. Cl.$^5$ .................. H04N 5/44; H04B 11/00
[52] U.S. Cl. .................. 455/151; 358/194.1; 455/603
[58] Field of Search .................. 358/194.1; 455/151, 455/352, 353, 603

[56] References Cited

U.S. PATENT DOCUMENTS 4,162,513  7/1979  Beyers, Jr. .................. 358/191
4,386,436  5/1983  Kocher .................. 455/151

Primary Examiner—Tommy P. Chin
Attorney, Agent, or Firm—Joseph S. Tripoli; Peter M. Emanuel; Thomas F. Lenihan

[57] ABSTRACT

A channel number data entry system for a television receiver employing a numeric keyboard allows the selection of cable channels having channel numbers greater than 99, without the use of a separate ENTER or 100s key. Specifically, if the leading digit of a desired channel number is a number one, a measurement is made of the time interval during which the number one key is activated. If the measured time interval exceeds 2 seconds, then a three digit channel entry mode is enabled. If the measured time interval does not exceed 2 seconds, then a two digit channel entry mode is enabled. In both modes, the desired channel is tuned upon receipt of the final digit of the channel number.

8 Claims, 3 Drawing Sheets

5,020,139

THREE DIGIT CHANNEL ENTRY BY USE OF AN EXTENDED KEYPRESS

CROSS REFERENCE TO A RELATED APPLICATION

The subject application is related to a copending U.S. patent application Ser. No. 489,391 filed Mar. 5, 1990 and assigned to the same assignee as the present invention.

FIELD OF THE INVENTION

The subject application concerns the field of television receivers having channel selection capability including direct entry of digits.

BACKGROUND OF THE INVENTION

Broadcast television channels in the United States are assigned channel numbers between 2 and 83, inclusive. Until recently, the cable television channel numbering system differed from the broadcast television channel numbering system, in that cable television channels were numbered from 2 to 99. Despite this difference, all broadcast television channels and cable television channels could be selected by entering, at most, two digits via a keyboard, mounted on the television receiver itself, or on a remote control unit.

This limit of two digits per channel number has allowed the development of television receivers in which the tuner is controlled to select the desired channel immediately upon receiving the second digit of the channel number. The RCA CTC-140 color television receiver chassis, manufactured by Thomson Consumer Electronics, Inc., Indianapolis, Indiana, is an example of such a system.

Recently in the United States, frequency space has been allocated for cable television channels having numbers greater than 99, thereby requiring a three-digit keyboard data entry system. The Electronics Industries Association (EIA) has recommended the following numbering system for cable channels.

| CABLE CHANNEL # | PICTURE CARRIER FREQUENCY | BAND |
| --- | --- | --- |
| 65–89 | 313.25 MHz–613.25 MHz | UHF |
| 90–94 | 619.25 MHz–643.25 MHz | UHF |
| 95–99 | (historically called A-1 to A-5) | Low VHF |
| 100–139 | 649.25 MHz–885.25 MHz | UHF |

Cable channel number 95 to 97 reside in the commercial FM radio broadcast band (88 MHz–108 MHz) and are not usually used in order to avoid interference between the desired television signal and the undesired FM radio signal.

Two prior three-digit channel selection system are known. In the first of these known systems, the keyboard includes an ENTER key for signaling the completion of a channel number entry. Such a system is known from the MBC-300 remote control unit manufactured by Zenith Corporation. There are four disadvantages to this approach. First, viewers have become accustomed to the above-mentioned immediate reaction of the television receiver in tuning a channel upon receipt of the last digit entered by the viewer. This desirable feature is lost in a system which employs an ENTER key. Second, operation of the ENTER key undesirably adds a separate keystroke to the selection of all channels, requiring three keystrokes to select most channels, and four keystrokes to select channels greater than 99. Third, the cost and complexity of the keyboard, keycode encoding and keycode decoding is increased by the addition of the ENTER key. Fourth, it requires an additional key on keyboards which in recent years have become more and more crowded as new features have been added. For example, the keyboard of the RCA CRK-55 remote control unit includes 80 keys. Adding an ENTER key to such complex keyboards is undesirable, in that a user may have to search among all those keys for the additional ENTER key.

In the second of the known prior three-digit channel selection systems, a remote control unit includes a "100s" key. The operation of the 100s key enables a three digit channel number entry mode, by causing the entry of the digit 1 in the leftmost place of the three-digit channel number. Such a remote control unit is manufactured by Magnavox Corporation and bears model number UR111MX. This approach also exhibits the above-mentioned feature of an immediate reaction of the television receiver by tuning a channel upon receipt of the last digit entered by the viewer. However, it has the three other disadvantages discussed above with respect to the separate ENTER key.

SUMMARY OF THE INVENTION

It is herein recognized that it is desirable to provide a channel selection system for a television receiver which is capable of selecting channels having channel numbers greater than 99, which system does not require the use of either an ENTER key or a 100s key, and which will tune a channel corresponding to a desired two digit channel immediately upon entry of the second digit. According to the invention, a keyboard system having three-digit channel number data entry capability measures the period in which the first key is activated, if the first key corresponds to the digit 1. If the time measurement exceeds a predetermined time interval, then a three digit channel number is presumed, and tuning will not occur immediately after the entry of the second digit but rather, after the entry of the third digit. If, however, the time measurement does not exceed a predetermined interval, then a two digit channel number is presumed and tuning is caused to occur immediately after the entry of the second channel number.

DETAILED DESCRIPTION OF THE EMBODIMENT

Figure 1:
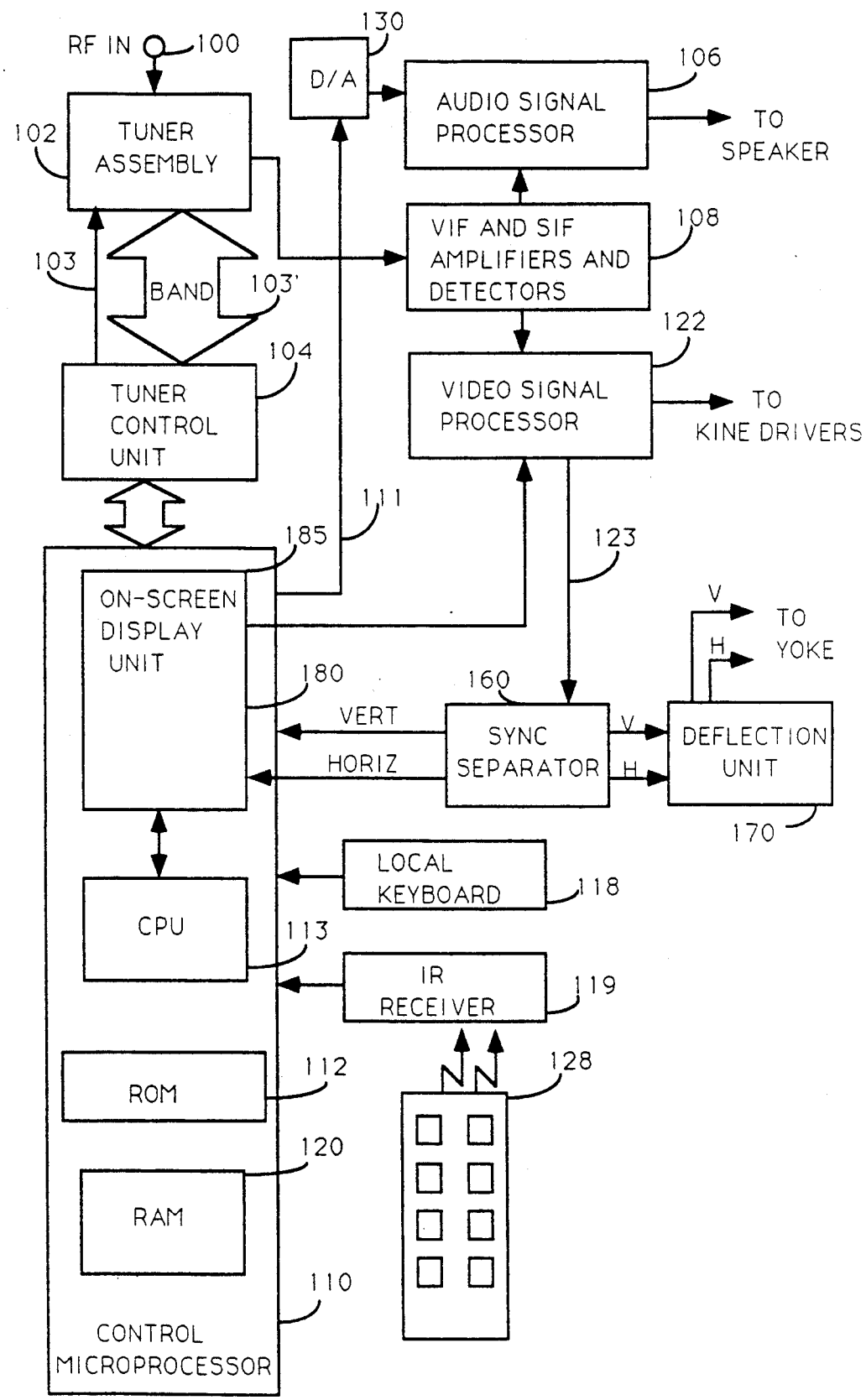
FIG. 1 shows, in block diagram form, an apparatus suitable for practicing the invention.

Referring to FIG. 1, a television receiver includes an RF input terminal 100 which receives radio frequency (RF) signals and applies them to a tuner assembly 102. Tuner assembly 102 selects and amplifies a particular RF signal under control of a tuner controller 104 which provides a tuning voltage via a wire 103, and band-switching signals via signal lines represented by the broad double-ended arrow 103'.

Tuner assembly 102 converts the received RF signal to an intermediate frequency (IF) signal and provides an IF output signal to video (VIF) and sound (SIF) amplifier and detector unit 108. VIF/SIF amplifier and detector unit 108 amplifies the IF signal applied to its input terminal and detects the video and audio information contained therein. The detected video information is applied as one input of a video processor unit 122. The detected audio signal is applied to an audio processor 106 for processing and amplification before being applied to a speaker (not shown).

Video signal processor 122 supplies a composite video signal to a sync separator unit 160 which produces vertical (V) and horizontal (H) synchronizing signals at respective outputs. The horizontal and vertical synchronizing signals are applied to a horizontal and vertical deflection unit 170 for generating scanning control signals for application to the yoke windings of a picture tube assembly (not shown).

Tuner controller 104 (which may be within control microcomputer 110) generates the tuning voltage and band-switching signals in response to control signals applied from a system control microcomputer ($\mu$C) 110. The terms "microcomputer" and "microprocessor", as used herein, are equivalent. It is also recognized that the control function of microcomputer 110 may be performed by an integrated circuit especially manufactured for that specific purpose (i.e., a "custom chip"), and the term "controller", as used herein, is also intended to include such a device. Microcomputer 110 receives user-initiated commands from an infrared (IR) receiver 119 and from a "local" keyboard 118 mounted on the television receiver itself. IR receiver 119 receives IR transmissions from remote control transmitter 128. Microcomputer 110 includes a central processing unit (CPU) 113, a program memory (ROM) 112, and stores channel-related data in a random-access memory (RAM) 120. RAM 120 may be either internal to, or external to, microprocessor 110, and may be of either the volatile or non-volatile type. The term "RAM" is also intended to include electrically-erasable programmable read only memory (EEPROM). One skilled in the art will recognize that if volatile memory is utilized, that it may be desirable to use a suitable form of standby power to preserve its contents when the receiver is turned off.

Microprocessor 110 may also include an on-screen display unit (OSD) 185 for generating auxiliary signals suitable for displaying indicia, such as characters, for display on the display screen of the picture tube. Alternatively, on-screen display unit 185 may be external to microprocessor 110.

Microprocessor 110 also includes a timer 122 for timing an interval under control of CPU 113. In the alternative, timer 122 may be external to microprocessor 110, or the timing function may be accomplished in software by executing sets of instructions which cause the occurrence of precisely defined delay periods. These sets of instructions are usually in the form of subroutines, known in the art as timing loop subroutines, which are called by the CPU, as needed. The television receiver described thus far is known from the RCA CTC-140 color television receiver manufactured by Thomson Consumer Electronics, Inc., Indianapolis, Indiana.

Figure 2:
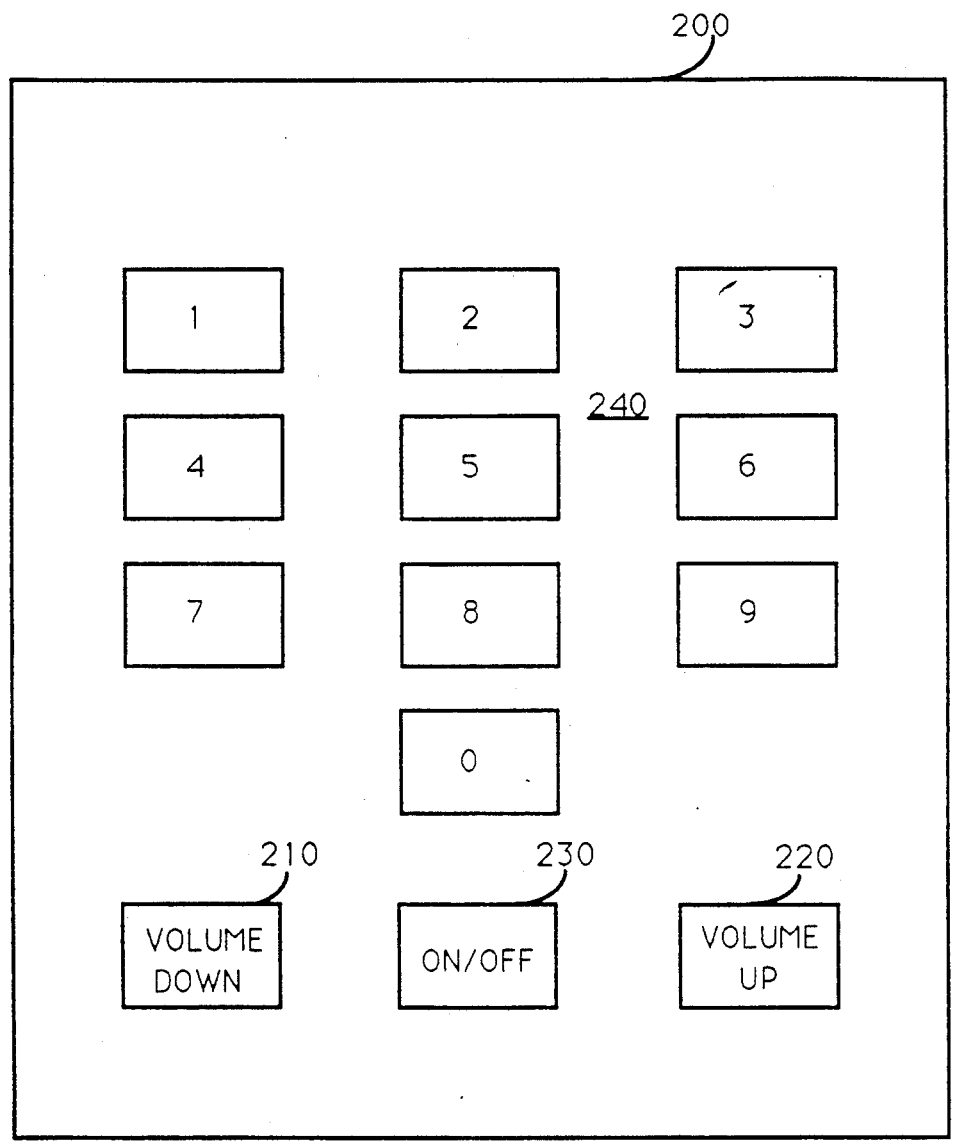
FIG. 2 shows the keyboard of a remote control unit suitable for use with the invention.

FIG. 2 shows the keyboard 200 of a remote control transmitter for controlling a color television receiver. Keyboard 200 includes a VOLUME DOWN key 210, a VOLUME UP key 220, an ON/OFF key 230, and a 0-9 numeric keypad, generally designated 240, for entering numeric data, such as channel number.

The present invention is directed to a channel number data entry system for a television receiver employing a numeric keyboard, which system allows the selection of cable channels having channel numbers greater than 99, without the use of a separate ENTER or 100s key. Specifically, if the leading digit of a desired channel number is a number one, a measurement is made of the time interval during which the number one key is activated. If the measured time interval exceeds 2 seconds, then a three digit channel entry mode is enabled. If the measured time interval does not exceed 2 seconds, then a two digit channel entry mode is enabled. In both modes, the desired channel is tuned upon receipt of the final digit of the channel number.

Figure 3:
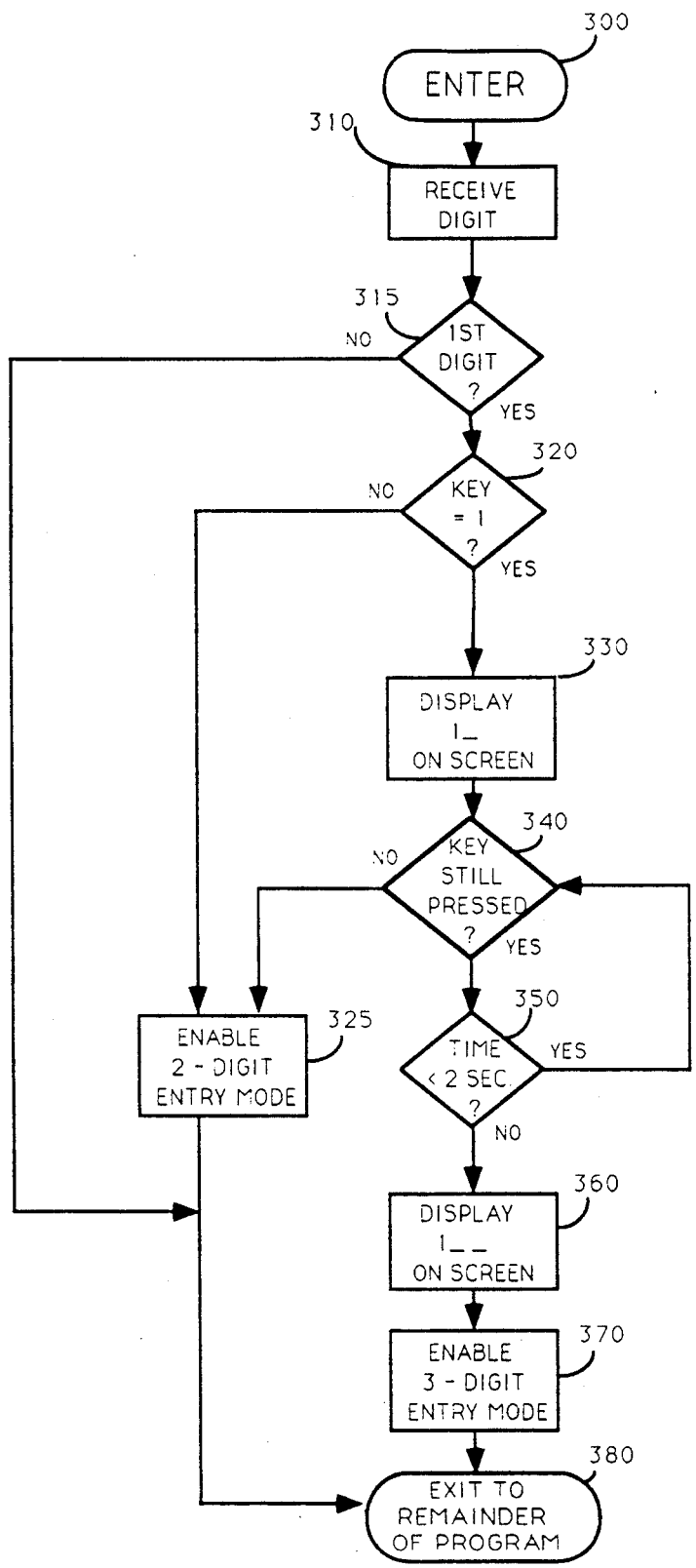
FIG. 3 is a flowchart showing a portion of the control program of the controller of FIG. 1.

An embodiment of the present invention will be described with reference to the flowchart of FIG. 3. FIG. 3 shows a portion of the keyboard decoding routine of the control program of microprocessor 110. The purpose of the portion of the routine shown in FIG. 3 is to detect the extended keypress of the number 1 key which causes the enabling of the three digit channel entry mode. The usual keycode decoding and display functions are performed in another portion of the keyboard decoding routine of the control program of microprocessor 110. The keycode decoding and display functions are not shown in FIG. 3 because they are known per se and need not be described here.

The routine of FIG. 3 is executed each time a keycode is received. The routine is entered at step 300 and receives a digit from IR receiver 119, or from local keyboard 118, at step 310. At step 315, a check is made to determine if this is the first digit entered for this particular channel number. If so, then the program advances to step 320, at which a check is made to see if the first digit received is the number 1. All channel numbers greater than 99 begin with the number 1. Therefore, if the first digit received is not the number one, then the no path is taken from step 320 to step 325 because the desired channel must have a two digit channel number.

If, however, the first digit received is the number 1 then the yes path is taken from step 320 to step 330. At step 330, the message 1. is caused to be displayed on the display screen. That is, if the first digit received is the number 1, then the desired channel number may fall in a first range from 10 to 19, or a second range from 100 to 199.

According to the invention, these two ranges (i.e., 10-19, and 100-199) may be distinguished from each other by the length of time in which the number 1 key for the leading digit is activated. That is, if the number 1 key is held activated for a period of at least 2 seconds, then a 3-digit channel number entry mode is enabled. If not, then a 2-digit channel number entry mode is enabled. Accordingly, at step 340 a check is made to see if the number 1 key is still pressed, if not then a short activation is detected, and the 2-digit entry mode is enabled at step 325. If the number 1 key is still held active by the user, then the program advances to a timing loop comprising steps 350 and 340, which times a 2 second period while repeatedly checking for a release of the number 1 key. As noted above, exercising the timing function of step 350 may entail either reading the output of a hardware timer such as timer 122, or executing a timing loop subroutine. If the 2 second time interval has expired, then the program advances to step 360 at which the message 1.. is caused to be displayed, and the 3-digit channel number entry mode is enabled at step 370. The program is then exited at step 380 to the remainder of the keyboard decoding routines, known per se.. Step 380 is also reached directly from step 315 for the second and third digits received, since they do not affect the decision of whether or not the channel number is greater than 99.

When a user wishes to enter the cable channel number 135, apparatus in accordance with the subject invention performs as follows. The user would first press the number 1 key. In response, the OSD circuitry would cause the display of 1.. If the user does not release the number 1 key, but rather holds it down for 2 seconds, then the display would then change to 1... This display indicates to the user that the three digit channel number entry mode has been entered. The display would show 1 3. in response to the entering of the digit 3, and 1 3 5 in response to the entering of the last digit. Immediately after receiving the final digit of the three digit channel number, in this example the numeral 5, control microprocessor 110 causes tuner assembly 102 to tune to cable channel 135.

It is herein recognized that the addition of an ENTER key or 100s key to keyboard of the remote control unit may require the modification of the control program of both the remote control unit (to detect, process and transmit the new keycode), and the control program of the controller in the television receiver (to receive, decode and process the new keycode).

The subject channel number data entry system described above avoids the necessity of modifying the control program of the remote control unit, because the invention resides in the television receiver and not in the remote control unit. As a result of the fact that no modification of the remote control unit is necessary, existing remote control units may be used when practicing the invention.

Further advantages of the present invention are that keyboard complexity is not increased, the cost of adding the additional key is saved, and the cost modifying the control program of the remote control unit is saved.

As noted above, many modern multifunction television receivers employ a remote control unit having a keyboard including a relatively large number of keys. It is an advantage of the subject invention that a further key need not be added to the keyboard, in that the user will not be forced to search among a multitude of other keys for an ENTER or 100s key.

The term consumer electronic equipment, as used herein, includes television receivers and radios. The term television receiver, as used herein, includes television receivers having a display device (commonly known as television sets) and television receivers without a display device, such as VCRs.

What is claimed is:

1. Data entry apparatus, comprising:
   keyboard means including a plurality of keys for generating at an output keycodes corresponding to individual ones of said keys when said keys are activated by a user;
   control means coupled to said keyboard means for receiving said keycodes and for generating a control signal in response thereto;
   said control means operating in a first mode to generate said control signal upon receiving the second of two of said keycodes consecutively generated by said keyboard means, and operating in a second mode to generate said control signal upon receiving the third of three of said keycodes consecutively generated by said keyboard means;
   said control means timing an interval during which the first keycode is present at said output of said keyboard when said first group of data corresponds to a predetermined value, said control means operating in said second mode when said interval exceeds a predetermined time period, and operating in said first mode when said interval does not exceed said predetermined time period.

2. Channel selection apparatus for a television receiver, comprising:
   keyboard means including a plurality of keys for generating at an output keycodes corresponding to digits of two and three digit channel numbers when said keys are activated by a user;
   control means coupled to said keyboard means for receiving said keycodes and for generating a tuning control signal in response thereto;
   said control means operating in a first mode to generate said tuning control signal upon receiving the second digit of one of said two digit channel numbers, and operating in a second mode to generate said tuning control signal upon receiving the third digit of one of said three digit channel numbers;
   said control means timing an interval during which data corresponding to the first digit of one of said two and three digit channel numbers is present at said output of said keyboard when said first digit corresponds to a predetermined value, said control means operating in said second mode when said interval exceeds a predetermined time period, and operating in said first mode when said interval does not exceed said predetermined time period.

3. The apparatus of claim 2 wherein said predetermined value is corresponds to the digit one.

4. The apparatus of claim 3 wherein said predetermined time interval is two seconds.

5. Channel selection apparatus for a television receiver, comprising:
   keyboard means including a plurality of keys for generating at an output keycodes corresponding to digits of two and three digit channel numbers when said keys are activated by a user;
   control means coupled to said keyboard means for receiving said keycodes and for generating a tuning control signal in response thereto; and
   timing means for timing an interval, said timing means being coupled to said control means;
   said control means operating in a first mode to generate said tuning control signal upon receiving the second digit of one of said two digit channel numbers, and operating in a second mode to generate said tuning control signal upon receiving the third digit of one of said three digit channel numbers;
   said control means causing said timing means to time said interval during which data corresponding to the first digit of one of said two and three digit channel numbers is present at said output of said keyboard when said first digit corresponds to a predetermined value, said control means operating in said second mode when said interval exceeds a predetermined time period, and operating in said first mode when said interval does not exceed said predetermined time period.

6. The apparatus of claim 5 wherein said predetermined value is corresponds to the digit one.

7. The apparatus of claim 6 wherein said predetermined time interval is two seconds.

8. Channel selection apparatus for a television receiver, comprising:

keyboard means including a plurality of numeric keys for generating at an output keycodes corresponding to digits of two and three digit channel numbers when said keys are activated by a user;

control means coupled to said keyboard means for receiving said keycodes and for generating a tuning control signal in response thereto;

said control means operating in a first mode to generate said tuning control signal upon receiving the second digit of one of said two digit channel numbers, and operating in a second mode to generate said tuning control signal upon receiving the third digit of one of said three digit channel numbers;

said control means timing an interval during which data corresponding to the first digit of one of said two and three digit channel numbers is present at said output of said keyboard when said first digit corresponds to the number one, said control means operating in said second mode when said interval exceeds a predetermined time period, and operating in said first mode when said interval does not exceed said predetermined time period.

* * * * *